(12) United States Patent
Ngo et al.

(10) Patent No.: US 6,441,490 B1
(45) Date of Patent: Aug. 27, 2002

(54) LOW DIELECTRIC CONSTANT STOP LAYER FOR INTEGRATED CIRCUIT INTERCONNECTS

(75) Inventors: Minh Van Ngo, Fremont; Christy Mei-Chu Woo, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/774,849

(22) Filed: Jan. 30, 2001

Related U.S. Application Data
(60) Provisional application No. 60/256,905, filed on Dec. 18, 2000.

(51) Int. Cl.[7] .............................................. H01L 29/40
(52) U.S. Cl. ..................... 257/758; 257/42; 257/701; 257/751; 257/762
(58) Field of Search ....................... 257/42, 751, 758, 257/762, 763, 700, 701; 438/620, 622, 624, 637; 357/71, 75, 47

(56) References Cited

U.S. PATENT DOCUMENTS

| | | | | |
|---|---|---|---|---|
| 4,933,743 A | * | 6/1990 | Thomas et al. ............. | 257/742 |
| 5,712,194 A | * | 1/1998 | Kanazawa ................... | 438/618 |
| 6,124,198 A | * | 9/2000 | Moslehi ...................... | 438/622 |
| 6,127,258 A | * | 10/2000 | Watanabe et al. ........... | 438/625 |
| 6,194,304 B1 | * | 2/2001 | Morozumi et al. ......... | 438/618 |
| 6,291,334 B1 | * | 9/2001 | Somekh ...................... | 438/597 |
| 6,326,305 B1 | * | 12/2001 | Avanzino et al. ........... | 438/633 |

\* cited by examiner

*Primary Examiner*—David Nelms
*Assistant Examiner*—Dao H Nguyen
(74) *Attorney, Agent, or Firm*—Mikio Ishimaru

(57) ABSTRACT

An integrated circuit and manufacturing method therefor is provided having a semiconductor substrate with a semiconductor device and a device dielectric layer formed on the semiconductor substrate. A channel dielectric layer on the device dielectric layer has a channel opening and a conductor core filling the channel opening. A via stop layer is formed over the channel dielectric layer to have a hydrogen concentration below 15 atomic % and a via dielectric layer is formed over the via stop layer and has a via opening. A second channel dielectric layer over the via dielectric layer has a second channel opening. A second conductor core, filling the second channel opening and the via opening, is connected to the semiconductor device.

6 Claims, 2 Drawing Sheets

but has eluded those skilled in the art.

LOW DIELECTRIC CONSTANT STOP LAYER FOR INTEGRATED CIRCUIT INTERCONNECTS

CROSS-REFERENCE TO RELATED APPLICATION(S)

This application claims the benefit of U.S. Provisional Patent Application No. 60/256,905 filed on Dec. 18, 2000, which is incorporated herein by reference thereto.

TECHNICAL FIELD

The present invention relates generally to semiconductors and more specifically to etch stop layers in semiconductor processing.

BACKGROUND ART

In the manufacture of integrated circuits, after the individual devices, such as the transistors, have been fabricated in the silicon substrate, they must be connected together to perform the desired circuit functions. This interconnection process is generally called "metallization", and is performed using a number of different photolithographic and deposition techniques.

In one interconnection process, which is called a "single inlaid" technique, channels of conductor material are deposited in a channel dielectric layer. The process starts with the placement of a first channel etch stop layer and a first channel dielectric layer, which are respectively a nitride and an oxide layer, over the semiconductor devices. A first inlaid step photoresist is then placed over the oxide layer and is photolithographically processed to form the pattern of the first channels. An anisotropic oxide etch is then used to etch out the channel oxide layer to form the first channel openings. The inlaid step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductor material and to act as a barrier material to prevent diffusion of such conductor material into the oxide layer and the semiconductor devices. A first conductor material is then deposited and subjected to a chemical-mechanical polishing process which removes the first conductor material above the first channel oxide layer and inlays the first conductor material in the first channel openings to form the first channels.

In another interconnection process, which is called a "dual inlaid" technique, vias and channels are formed at the same time. The via formation step of the dual inlaid process starts with the deposition of a thin etch stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second inlaid step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The inlaid photoresist is then removed, and a nitride etch process removes the nitride above the first channels in the via areas. An adhesion layer is often deposited to coat the via openings and the second channel openings. Next, a barrier layer is deposited on the adhesion layer, and the two layers are collectively referred to as the barrier layer. This is followed by a deposition of the second conductor material in the second channel openings and the via openings to form the second channel and the via. A second chemical mechanical polishing process leaves the two vertically separated, horizontally perpendicular channels connected by vias.

The use of the single and dual inlaid techniques eliminate metal etch and dielectric gap fill steps typically used in the metallization process. The elimination of metal etch steps is important as the semiconductor industry moves from aluminum to other metallization materials, such as copper, which are very difficult to etch.

One drawback of using copper as the conductor material is that copper diffuses rapidly through various materials. Unlike aluminum, copper also diffuses through inter layer dielectric materials, such as silicon oxide. When copper diffuses through interlayer dielectric layers, it can cause leakage to neighboring interconnect lines on the semiconductor substrate. To prevent diffusion, highly diffusion resistive barrier materials, such as titanium, tantalum, tungsten, their nitrides, and combinations thereof, are used as barrier materials.

After deposition of the barrier layer, a seed layer of conductor material, such as copper, is deposited by an ion metal plasma (IMP) deposition, chemical vapor deposition (CVD), or an electroless plating process. This seed layer is subsequently used as one electrode in an electroplating process which deposits the conductor material which completely fills the channels and vias.

With the development of high integration and high-density very large scale integrated circuits, reductions in the size of transistors and interconnects has been accompanied by increases in switching speed of such integrated circuits. The closeness of the interconnects and the switching speeds have increased the problems due to switching slow-downs resulting from capacitance coupling effects between the closely positioned, parallel conductive channels connecting high switching speed semiconductor devices in these integrated circuits. Since the capacitance coupling effects are reduced when the dielectric constant of the material between the channels is reduced, this has rendered current silicon nitride, which has a dielectric constant in excess of 7.5, problematic for protective dielectric layers.

A solution for reducing the dielectric constant of the materials used in interconnects has been long sought but has eluded those skilled in the art. In this area, even small reductions in the dielectric constant are significant.

DISCLOSURE OF THE INVENTION

The present invention provides an integrated circuit having a semiconductor substrate with a semiconductor device and a device dielectric layer formed on the semiconductor substrate. A channel dielectric layer on the device dielectric layer has a channel opening, a barrier layer lining the channel opening, and a conductor core filling the channel opening. A via stop layer is formed over the channel dielectric layer to have low quantities of hydrogen below 15 atomic % and a via dielectric layer is formed over the via stop layer and has a via opening. A second channel dielectric layer over the via dielectric layer has a second channel opening. A second conductor core, filling the second channel opening and the via opening, is connected to the semiconductor device. The via stop layer halves the capacitive coupling between the channels compared to prior art via stop layers.

The present invention further provides a method for manufacturing an integrated circuit having a semiconductor substrate with a semiconductor device. A device dielectric layer is formed on the semiconductor substrate and a channel dielectric layer is formed on the device dielectric layer. A channel opening is formed in the channel dielectric layer, and a barrier layer is deposited to line the channel opening. A conductor core is deposited to fill the channel opening. A via stop layer is deposited by a non-hydrogen containing plasma deposition process over the channel dielectric layer to have low quantities of hydrogen below 15 atomic % and a via dielectric layer is formed over the via stop layer and has a via opening. A second channel dielectric layer over the via dielectric layer has a second channel opening. A second conductor core filling the second channel opening and the via opening is connected to the semiconductor device. The via stop layer halves the capacitive coupling between the channels compared to prior art via stop layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
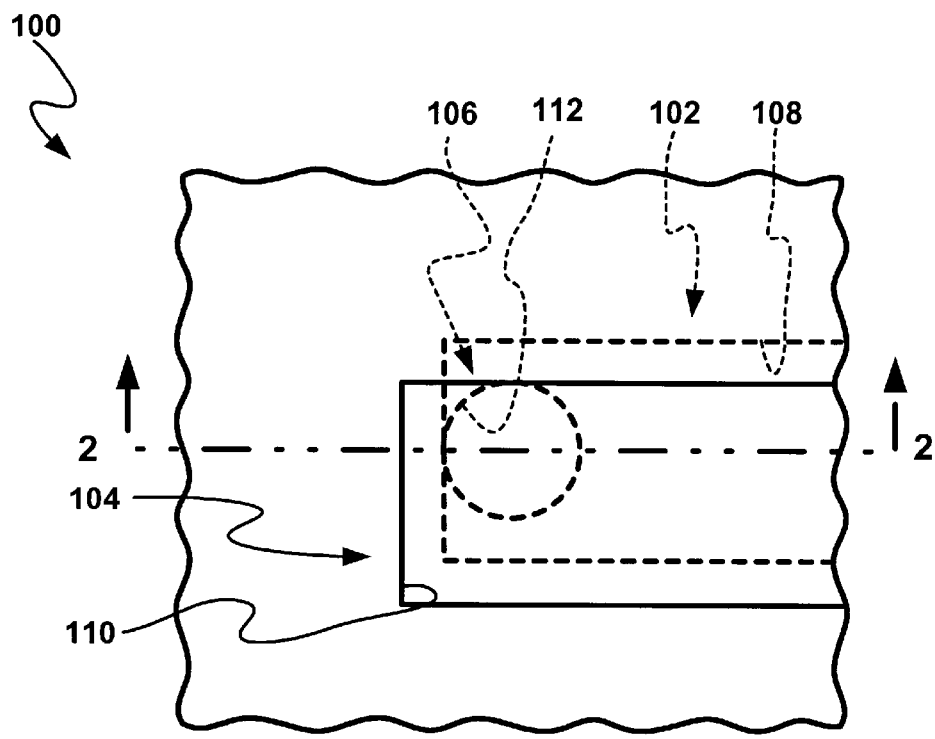
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112. The dielectric layers herein can be of dielectric materials, such as silicon oxide, or low dielectric constant materials, such as benzocyclobutane (BCB), hydrogen silsesquioxane (HSQ), borophospho silicate glass (BPSG), etc.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
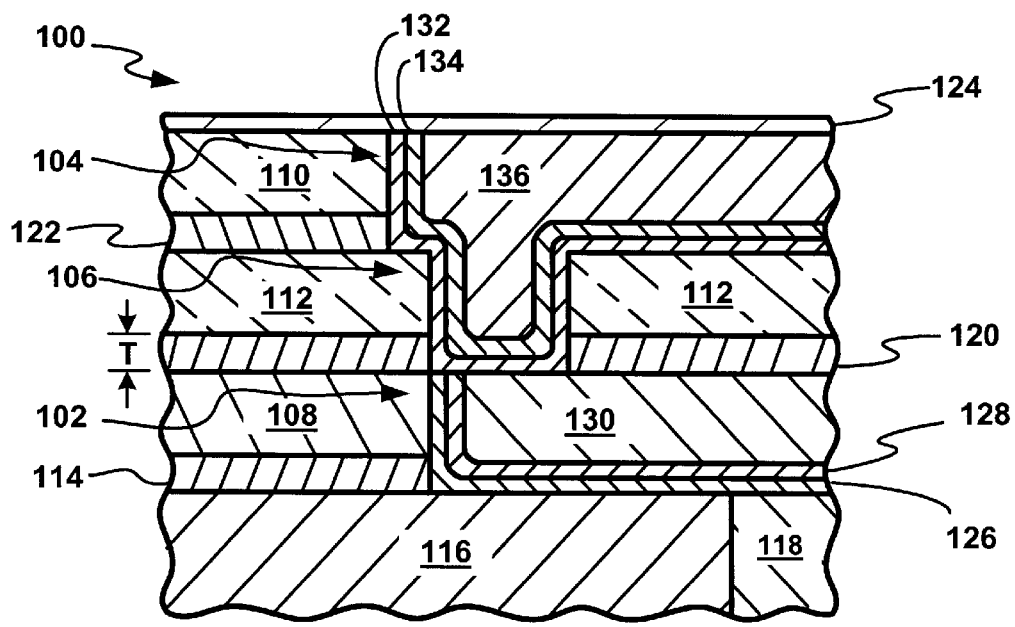
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts (not shown) are formed in the device dielectric layer 116 to connect to an operative semiconductor device (not shown). This is represented by the contact of the first channel 102 with a semiconductor device gate 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor materials of the conductor cores 130 and 136 are deposited. The seed layers 128 and 134 are of substantially the same conductor material of the conductor cores 130 and 136 and become part of the respective conductor cores 130 and 136 after the deposition.

The first channel stop layer 114, the via stop layer 120, and the second channel stop layer 122 are used as layers to stop the etching process which are used to etch and make the various channel and via openings in the respective first channel dielectric layer 108, the via dielectric layer 112, and the second channel dielectric layer 110. The stop layers are of a dielectric material deposited to a thickness "T" by a 500 watt plasma deposition process in an ammonia ($NH_3$) atmosphere at 4.8 torr pressure. Generally, the stop layer material is silicon nitride (SiN), which has a dielectric constant above 7.5 with a hydrogen ($H_2$) concentration above atomic % and which is deposited to a thickness "T" from 470 Å to 530 Å.

Figure 3:
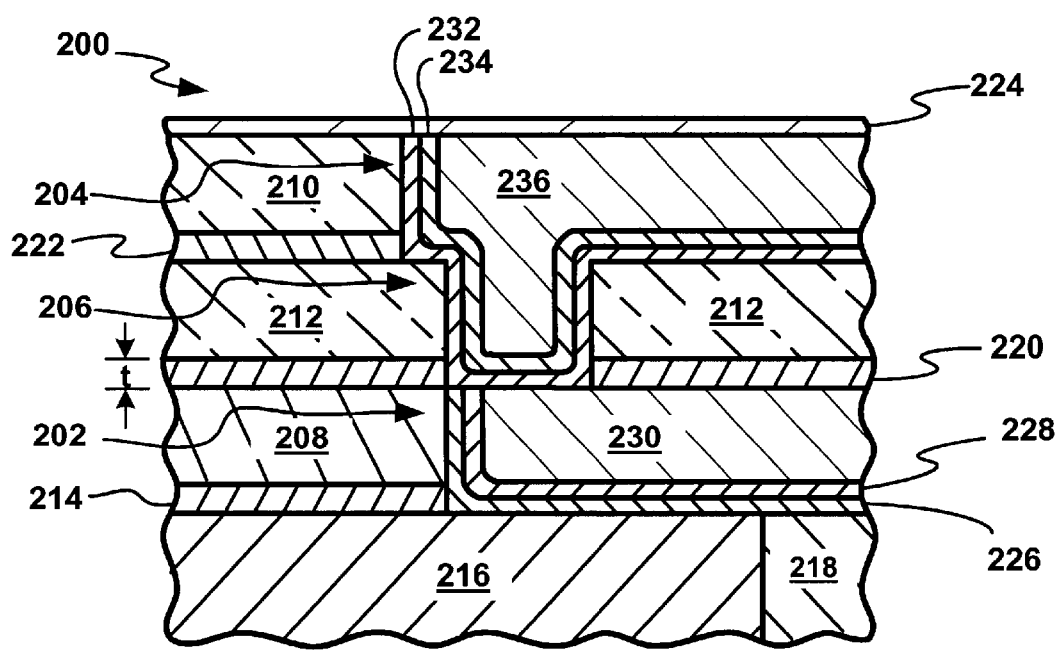
FIG. 3 is a cross-section similar to FIG. 2 (PRIOR ART) showing the stop layer according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor materials of the conductor cores 230 and 236 are deposited. The seed layers 228 and 234 are of substantially the same conductor material of the conductor cores 230 and 236 and become part of the respective conductor cores 230 and 236 after the deposition.

The first channel stop layer 214, the via stop layer 220, and the second channel stop layer 222 are used as layers to stop the etching process which are used to etch and make the various channel and via openings in the respective first channel dielectric layer 208, the via dielectric layer 212, and the second channel dielectric layer 210.

It has been determined that the prior art deposition process of the stop layers introduced hydrogen into the material which prevented the reduction of the dielectric constant and required the thickness "T" to avoid etching through the stop layer.

In the present invention, the stop layers are of a dielectric material deposited to a thickness "t" by a 450 watt plasma deposition process in an ammonia ambient at 4.2 torr pressure. The dielectric material deposited is silicon nitride with a low hydrogen concentration below 15 atomic %, which produces a dielectric constant below 6.5 and which is deposited to a thickness "t" from 270 Å to 330 Å.

With the reduced dielectric constant and the reduced thickness, the capacitive coupling effect between the first and second channels 202 and 204 is effectively reduced over 50%.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. An integrated circuit comprising:
    a semiconductor substrate having a semiconductor device provided thereon;
    first dielectric layer formed over the semiconductor substrate having an opening provided therein;
    a conductor core filling the opening and connected to the semiconductor device;
    a via stop layer formed over the first dielectric layer and the conductor core, the stop layer having a hydrogen concentration below 15 atomic %, wherein the via stop layer is deposited to a thickness whereby the capacitive coupling is reduced over 50% over a stop layer having a hydrogen concentration over 15 atomic %;
    a via dielectric layer formed over the via stop layer and having a via opening provided therein open to the conductor core;
    a second dielectric layer formed over the via dielectric layer and having a second opening provided therein open to the via opening; and
    a second conductor core filling the via and second openings and connected to the conductor core.

2. The integrated circuit as claimed in claim 1 wherein the conductor cores contain materials selected from a group consisting of copper, aluminum, gold, silver, an alloy thereof, and a combination thereof.

3. The integrated circuit as claimed in claim 1 wherein the via stop layer is of silicon nitride.

4. An integrated circuit comprising:
    a semiconductor substrate having a semiconductor device provided thereon;
    a device dielectric layer formed on the semiconductor substrate;
    a first channel stop layer formed over the device dielectric layer;
    a first channel dielectric layer formed on the device dielectric layer having a first channel opening provided therein;
    a first conductor core filling the first channel opening and connected to the semiconductor device;
    a via stop layer formed over the first channel dielectric layer and the first conductor core, the via stop layer having a hydrogen concentration below 15 atomic %;
    a via dielectric layer formed over the via stop layer and having a via opening provided therein open to the conductor core;
    a second channel stop layer formed over the via dielectric layer, the second channel stop layer having a hydrogen concentration below 15 atomic %, wherein the via and the second channel stop layers are deposited to thicknesses whereby the capacitive couplings are reduced over 50% over stop layers having a hydrogen concentration over 15 atomic %;
    a second channel dielectric layer formed over the second channel stop layer and having a second channel opening provided therein open to the via opening; and
    a second conductor core filling the via and second channel openings and connected to the first conductor core.

5. The integrated circuit as claimed in claim 4 wherein the conductor cores contain materials selected from a group consisting of copper, aluminum, gold, silver, an alloy thereof, and a combination thereof.

6. The integrated circuit as claimed in claim 4 wherein the via stop layer is of silicon nitride.

* * * * *